United States Patent
Johnson et al.

(10) Patent No.: US 9,768,238 B2
(45) Date of Patent: Sep. 19, 2017

(54) ELECTRICAL DEVICE TO MASK SYSTEMATIC LUMINANCE VARIATION

(71) Applicants: Andrew Wesley Johnson, Santa Barbara, CA (US); Johann Thomas Trujillo, Goleta, CA (US)

(72) Inventors: Andrew Wesley Johnson, Santa Barbara, CA (US); Johann Thomas Trujillo, Goleta, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/942,282

(22) Filed: Nov. 16, 2015

(65) Prior Publication Data

US 2017/0141171 A1    May 18, 2017

(51) Int. Cl.
*H01L 27/32* (2006.01)
(52) U.S. Cl.
CPC ........ *H01L 27/3262* (2013.01); *H01L 27/326* (2013.01)
(58) Field of Classification Search
CPC .......................... H01L 27/3262; H01L 27/326

USPC ............................................................ 257/40
See application file for complete search history.

(56) References Cited

U.S. PATENT DOCUMENTS

| | | | |
|---|---|---|---|
| 6,670,645 B2 | 12/2003 | Grushin | |
| 2005/0168417 A1* | 8/2005 | Ha | G09G 3/2011 345/76 |

FOREIGN PATENT DOCUMENTS

| WO | 03008424 A1 | 1/2003 |
|---|---|---|
| WO | 03040257 A1 | 5/2003 |
| WO | 03063555 A1 | 7/2003 |
| WO | 03091688 A2 | 11/2003 |
| WO | 2004016710 A1 | 2/2004 |

\* cited by examiner

*Primary Examiner* — Fernando L Toledo
*Assistant Examiner* — Adam S Bowen

(57) ABSTRACT

An electrical device containing pixel circuits, where at least one resistor is present within one pixel circuit to mask systematic luminance variation in organic light emitting diodes. The resistor can be located at one or more locations between electrodes. Each resistor has a defined resistor density, with distinct resistor values among pixel circuits to produce random variations in pixel luminance across a display containing plurality of pixel circuits.

5 Claims, 3 Drawing Sheets

ELECTRICAL DEVICE TO MASK SYSTEMATIC LUMINANCE VARIATION

BACKGROUND OF THE INVENTION

Field of the Invention

This invention relates to an electrical device containing luminescent diodes. In particular, an electrical device having pixel circuits for organic light emitting diodes, the organic light emitting diodes resulting from liquid deposition of organic semiconductor material on a backplane. More particularly, the incorporation of resistors into a multitude of pixel circuits thereby masking systematic luminance variation resulting from off-specification liquid deposition of luminescent materials. The electrical device containing luminescent diodes, also called a display device, can be mounted on the backplane containing a rigid or flexible substrate. The backplane typically contains electrical elements for pixel circuits and may also include thin film transistors for each pixel. Deposition of organic semiconductor materials on these backplanes, including liquid phase deposition, can produce non-uniformities in the resultant luminescent pixel light output, color, or other characteristics, which are collectively referred to as systematic variations, usually appearing in some fashion of patterned irregularities.

The application of resistors having distinct values in a multitude of pixel circuits provides a random variation, to combine with the systematic variation to mask luminance irregularities. The resulting display device provides increased manufacturing tolerance and improved yield for display devices.

Description of the Related Art

One option of an electronic device can include an organic light-emitting diode (OLED) display, or the like. OLED display devices utilizing one or more layers of organic semiconductor materials laminated with other supporting layers and sandwiched by two electrodes are used in many different kinds of electronic equipment. Manufacturing of these OLED electronic devices may be performed using solution deposition techniques. One process of making OLED electronic devices is to deposit organic layers over the substrate, also referred to as the backplane when containing electronic elements, by printing (e.g., ink-jet printing, continuous printing, etc.). In a printing process, the liquid composition being printed includes an organic material in a solution, dispersion, emulsion, or suspension with an organic solvent, with an aqueous solvent, or with a combination of solvents. After printing, the solvent(s) is(are) evaporated and the organic material remains to form an organic layer for the electronic device.

Liquid printing can be conducted in either non-continuous or continuous operation as disclosed in the prior art. The deposition of the liquid composition in either a continuous or non-continuous method may lead to non-uniformities in the resultant layer upon drying on the backplane. Specifically, as the liquid composition dries solvent diffuses into the surrounding environment. These non-uniformities often appear as a pattern of irregularities in the final luminescent pixels, and these patterns of irregularities are often referred to as systematic variations. While various techniques are used to minimize these systematic variations, problems persist with the manufacturing losses associated with scrapping these off-specification electronic devices.

In view of the foregoing it is believed additional improvement is required to optimize organic electronic devices.

SUMMARY OF THE INVENTION

The presently claimed invention is directed to an apparatus to overcome limitations associated with printing a liquid composition onto a backplane. Small variations in the volume of liquid composition deposited can result in small but noticeable variations in the luminance uniformity of the resultant display device. These variations often occur in regular pattern that the human eye can easily discern, and is very sensitive to any type of repeating pattern. Within the display industry, regular patterns of 1-2% are discernable to the human eye, and this type of systematic variation lowers the quality threshold for acceptable quality display devices. However, random variations of up to 5% within a display device are tolerated as acceptable by the human eye, accordingly, an acceptable quality threshold can be raised from 1-2% to 5% by achieving a random variation of luminance values.

To achieve the random variation of display luminance, a small random variation can be overlaid on top of the 1-2% systematic variation to mask the repeating patterns. One method for achieving this random variation is the application of the resistive layer at one or more locations in the sequential layers between the first and second electrode defining the pixel circuit. This resistive layer can have a resistor density of about zero to $1 \times 10^{-7}$ ohms/micrometer ($\Omega/\mu m^2$), where this level of resistor density can be achieved by, for example, using formulations having distinct resistor density deposited with a uniform thickness, or alternatively, a single formulation of resistor density deposited in distinct thickness levels.

In one embodiment, the resistor could be introduced into the backplane using many different techniques. One embodiment would be the use of amorphous or polysilicon material for the conduction path of the TFT design. The amorphous or polysilicon material's conductivity could be minutely altered by subtly varying the doping amount, thus achieving the desired resistor variation. Another embodiment would be placing a small amount of nickel chromium material within the TFT conduction path. A uniform size of nickel chromium material could be first sputtered (vacuum deposition) onto the backplane. The traces could then be masked accordingly and etched away by varying amounts to fluctuate the conductivity and produce a desired value of resistance. While nickel chromium is an example of one type of material, a large amount of suitable materials exist which could achieve the same effect by varying the material's physical dimensions.

The device contains at least the following elements.
A circuit for an electronic device, the circuit comprising:
  a thin film transistor;
  an organic light emitting diode;
  a first electrode;
  a second electrode; and
  a first resistor having a resistor density, wherein the thin film transistor, organic light emitting diode, and the first resistor are located between the first and second electrode, and the first resistor has non-zero resistor density.

In one embodiment of the circuit the first resistor is located between the first electrode and the thin film transistor. In another embodiment the first resistor is located between the thin film transistor and the organic light emitting diode. In another embodiment the first resistor is located between the organic light emitting diode and the second electrode.

In one embodiment the circuit can have two resistors, and in another embodiment the circuit can have three resistors. In one embodiment the first resistor is located between the first electrode and the thin film transistor, the second resistor is located between the thin film transistor and the organic light emitting diode, the third resistor is located between the organic light emitting diode and second electrode. In one embodiment the resistor density is about zero to $1\times10^{-7}$ $\Omega/\mu m^2$ of emitter area of the organic light emitting diode. In one embodiment the first electrode is an anode.

A pixel circuit for an electronic device, the pixel circuit comprising:
   a thin film transistor;
   an organic light emitting diode;
   a first electrode;
   a second electrode; and
   a first resistor, a second resistor, and a third resistor, each resistor having a resistor density, wherein the thin film transistor, organic light emitting diode, and the first, second, and third resistors are located between the first and second electrode, and the resistor density range of each resistor is about zero to $1\times10^{-7}$ $\Omega/\mu m^2$ of emitter area of the organic light emitting diode, and at least one of the first, second, or third resistor has non-zero resistor density.

In one embodiment of the pixel circuit at least two of the first, second, or third resistor have non-zero resistor density. In one embodiment of the pixel circuit each of the first, second, and third resistor have non-zero resistor density.

BRIEF DESCRIPTION OF THE DRAWINGS

The invention will be more fully understood from the following detailed description, taken in connection with the accompanying drawings, which form a part of this application and in which.

Figure 1:
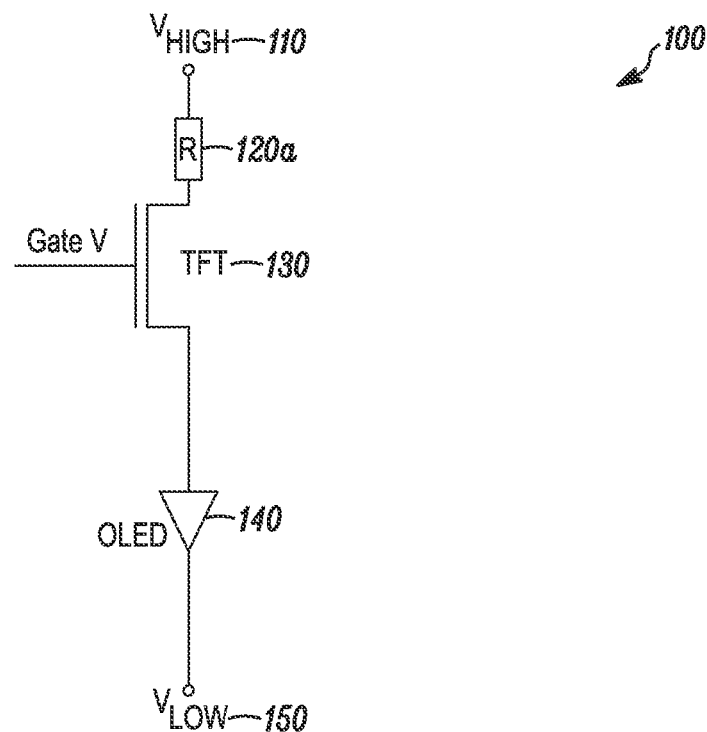
FIG. 1 represents an embodiment of the present invention with a first resistor located between a first electrode and a thin film transistor.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION OF THE INVENTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims.

Definitions and Clarification of Terms

Before addressing details of embodiments described below, some terms are defined or clarified.

The term "active" when referring to a layer or material, is intended to mean a layer or material that exhibits electronic or electro-radiative properties. In an electronic device, an active material electronically facilitates the operation of the device. Examples of active materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "backplane" is used to describe a substrate containing electronic elements.

The term "circuit" or "pixel circuit" is intended to mean a collection of electronic components that collectively, when properly connected and supplied with the proper potential(s), performs a function.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "electrode" is used to mean one of the two points through which electricity flows. An anode is a positive electrode and a cathode is a negative electrode.

The term "electroluminescent" or "electroactive" when referring to a layer or material, is intended to mean a layer or material that exhibits electronic or electro-radiative properties. In an electronic device, an electroactive material electronically facilitates the operation of the device. Examples of electroactive materials include, but are not limited to, materials which conduct, inject, transport, or block a charge, where the charge can be either negative (an electron) or positive (a hole), and materials which emit radiation or exhibit a change in concentration of electron-hole pairs when receiving radiation. Examples of inactive materials include, but are not limited to, insulating materials and environmental barrier materials.

The term "electronic device" or sometimes "organic electronic device" is intended to mean a device including one or more organic semiconductor layers or materials.

The term "electron transport" or "electron injection" means, when referring to a layer, material, member or structure, such a layer, material, member or structure that promotes or facilitates migration of negative charges through such a layer, material, member or structure into another layer, material, member or structure.

The term "hole injecting" is synonymous with "electron withdrawing." Literally, holes represent a lack of electrons and are typically formed by removing electrons, thereby creating an illusion that positive charge carriers, called holes, are being created or injected. The holes migrate by a shift of electrons, so that an area with a lack of electrons is filled with electrons from an adjacent layer, which give the appearance that the holes are moving to that adjacent area. For simplicity, the terms holes, hole injecting, hole transport, and their variants will be used.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "liquid" is intended to include single liquid materials, combinations of liquid materials, and these may be solutions, dispersions, suspensions and emulsions.

The term "organic electronic device" or sometimes just "electronic device" is intended to mean a device including one or more organic semiconductor layers or materials. An organic electronic device includes, but is not limited to devices that convert electrical energy into radiation (e.g., a light-emitting diode, light emitting diode display, diode laser, or lighting panel).

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels. A sensor array can include pixels that may or may not include subpixels.

The term "resistor" or "resistive," when referring to a material, is intended to mean a material that exhibits a substantially linear relationship between current and voltage over the normal operating voltages of an electronic device in which such material resides, regardless of direction of current flow. In other words, over the normal operating voltages of the electronic device, the ratio of current to voltage for such material is substantially constant regardless whether the material is forward biased (e.g., positive polarity) or reverse biased (e.g., negative polarity).

The term "substrate" is used to describe a surface upon which electronic elements are located to produce a backplane.

The term "thickness" is used to describe the vertical dimension of the layer upon a substrate or backplane. The vertical dimension is along a vector normal to the surface of the substrate or backplane.

The term "thin-film transistor" or "TFT" is intended to mean a field-effect transistor in which at least a channel region of the field-effect transistor is not principally a portion of a base material of a substrate. In one embodiment, the channel region of a TFT includes a-Si, polycrystalline silicon, or a combination thereof.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic cell, and semiconductive member arts.

Description of Pixel Circuits

Throughout the following detailed description similar reference characters refers to similar elements in all figures of the drawings.

FIG. 1 represents an embodiment of the present invention with a pixel circuit 100 located on a backplane (not shown). A first electrode 110 is connected to a first resistor 120a. The first resistor 120a is also connected to a source side of thin film transistor (TFT) 130, and a drain side of TFT 130 is connected to an organic light emitting diode (OLED) 140. The OLED 140 is connected to a second electrode 150.

Figure 2:
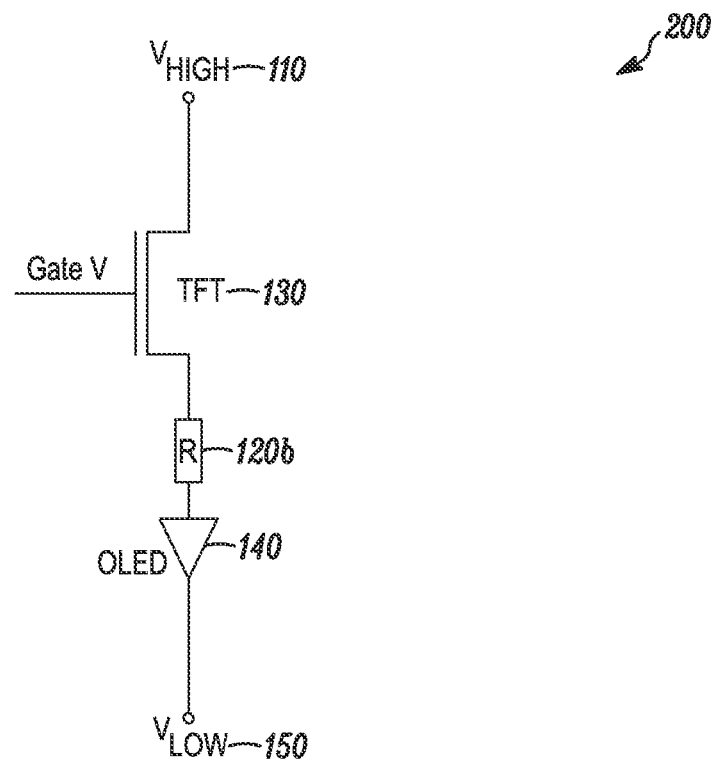
FIG. 2 represents an embodiment of the present invention with a first resistor located between a thin film transistor and an organic light emitting diode.

FIG. 2 represents an embodiment of the present invention with a pixel circuit 200 located on a backplane (not shown). The first electrode 110 is connected to the source side of TFT 130, and a first resistor 120b is connected to the drain side of TFT 130. The first resistor 120b is also connected to the OLED 140, and the OLED 140 is connected to the second electrode 150. Note the location of the first resistor 120b is distinct from that illustrated in FIG. 1, and the designation of "a" and "b" are used to denote the location the resistor 120 within the pixel circuit 100 or 200.

Figure 3:
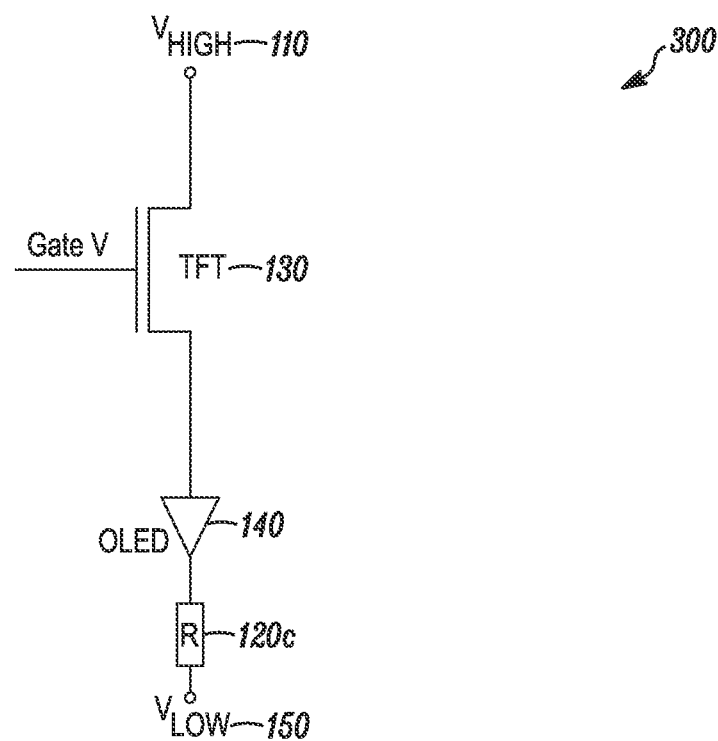
FIG. 3 represents an embodiment of the present invention with a first resistor located between an organic light emitting diode and a second electrode.

FIG. 3 represents an embodiment of the present invention with a pixel circuit 300 located on a backplane (not shown). The first electrode 110 is connected to the source side of TFT 130, and the drain side of TFT 130 is connected to the OLED 140. A first resistor 120c is also connected to the OLED 140, and is also connected to the second electrode 150. Note the location of the first resistor 120c is distinct from that illustrated in FIG. 1 and FIG. 2, and the designation of "a", "b", and "c" are used to denote the location the resistor 120 within the pixel circuit 100, 200, or 300.

Figure 4:
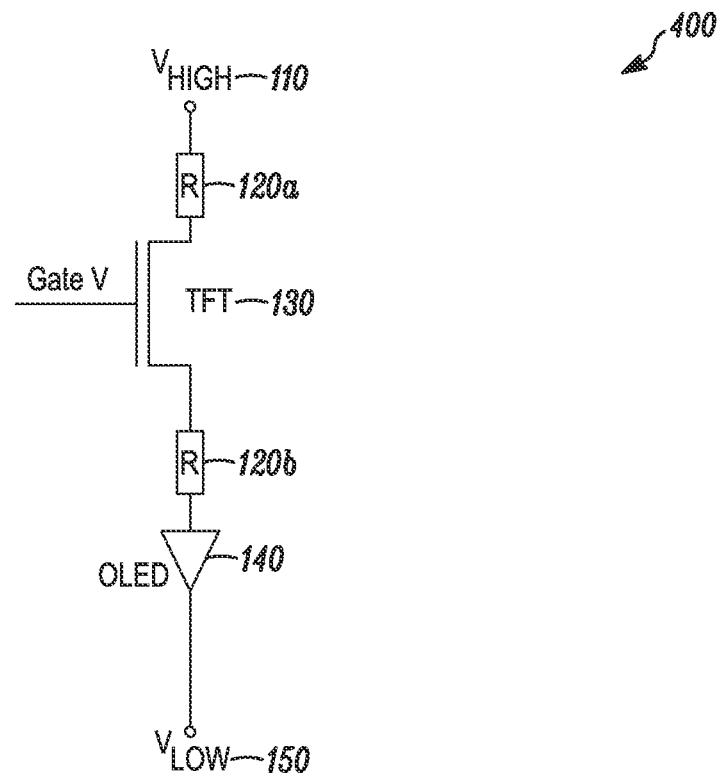
FIG. 4 represents an embodiment of the present invention with a first resistor and a second resistor located between a first electrode and a second electrode.

FIG. 4 represents an embodiment of the present invention with a pixel circuit 400 located on a backplane (not shown). The first electrode 110 is connected to the first resistor 120a. First resistor 120a is also connected to source side of TFT 130, and the drain side of TFT 130 is connected to the second resistor 120b. The second resistor 120b is also connected to the OLED 140, and the OLED 140 is connected to the second electrode 150. Note the locations of the first resistor 120a and the second resistor 120b are consistent with the locations illustrated in FIG. 1 and FIG. 2. In addition to the specific resistors of FIG. 4, any combination of two resistors can also be used, for example, resistors 120a and 120c, or resistors 120b and 120c.

Figure 5:
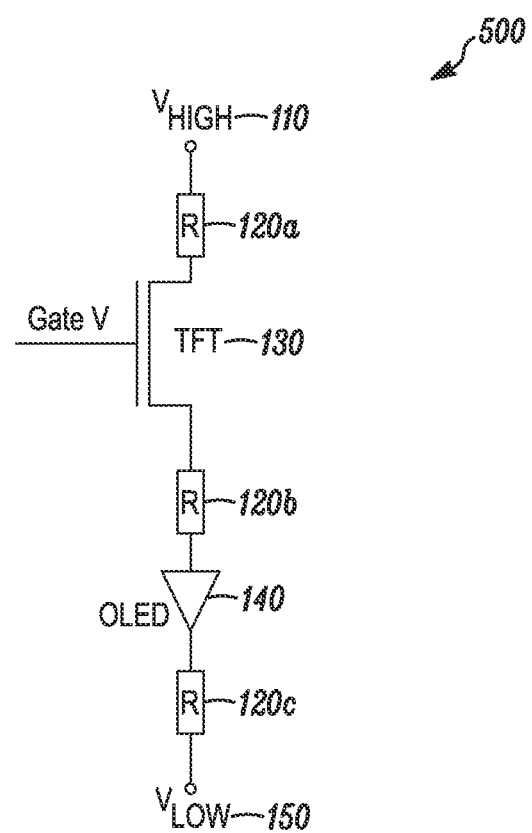
FIG. 5 represents an embodiment of the present invention with a first resistor, a second resistor, and a third resistor located between a first electrode and a second electrode.

FIG. 5 represents an embodiment of the present invention with a pixel circuit 500 located on a backplane (not shown). The first electrode 110 is connected to the first resistor 120a. First resistor 120a also connected to source side of TFT 130, and the drain side of TFT 130 is connected to the second resistor 120b. The second resistor 120b is also connected to the OLED 140, and the OLED 140 is connected to the third resistor 120c which is also connected to the second electrode 150. Note the locations of the first resistor 120a, the second resistor 120b, and the third resistor 120C are consistent with the locations illustrated in FIG. 1, FIG. 2, and FIG. 3.

While the above reference characters are drawn for an n-type TFT design, this disclosure also applies to a backplane containing p-type transistors. The figures can be applied to a p-type TFT design by just switching the orientation of the source and drain. In addition, a possible top-emission design would place the OLED diode above the TFT next to Vhigh. This disclosure would also apply to this top-emission design and could use the same iteration of possible resistor locations as depicted in the above figures.

Deposition of the resistors can be achieved using a liquid deposition technique to produce a random distribution within an array of pixels, where the liquid deposition technique can encompass continuous or non-continuous processes. One method for achieving this random variation is the application of the resistive layer at one or more locations in the sequential layers between the first and second electrode defining the pixel circuit, as illustrated in FIG. 1-5. This resistive layer can have a resistor density of about zero to $1 \times 10^{-7}$ ohms/micrometer ($\Omega/\mu m^2$), where this level of resistor density can be achieved by, for example, using formulations having distinct resistor density deposited with a uniform thickness, or alternatively, a single formulation of resistor density deposited in distinct thickness levels. The required value of the resistor density is predicated on both the backplane and the OLED materials used in the electronic device.

Description of Electronic Device

Devices for which the pixel circuits described herein can be used include organic electronic light emitting devices. In such devices, an organic active layer is sandwiched between two electrode contact layers. At least one of the electrode contact layers is light-transmitting so that light can pass through the electrode contact layer. The organic active layer emits light through the light-transmitting electrode contact layer upon application of voltage across the electrode contact layers. Additional electroactive layers may be present between the light-emitting layer and the electrode contact layer(s).

It is well known to use organic electroluminescent compounds as the active component in such devices to provide the necessary colors. The printing of organic light emitting devices and associated pixel circuits described herein can employ liquid compositions containing electroluminescent materials having different colors. Such materials include, but are not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

To form the liquid compositions, the above materials are dissolved or dispersed in a suitable liquid composition. A suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), keytones (cyclopentatone) and mixtures thereof. Suitable solvents for photoactive materials have been described in, for example, published PCT application WO 2007/145979.

The OLED device has a first electrode layer, which is an anode layer, and a second electrode layer, which is a cathode layer. A photoactive layer is between them. Additional layers may optionally be present. Adjacent to the anode may be a buffer layer. Adjacent to the buffer layer may be a hole transport layer, comprising hole transport material. Adjacent to the cathode may be an electron transport layer, comprising an electron transport material. As an option, devices may use one or more additional hole injection or hole transport layers next to the anode and/or one or more additional electron injection or electron transport layers next to the cathode.

It should be appreciated from the foregoing description that the present device serves to mask systemic luminance variation using randomization of resistors, from a liquid dispenser, onto a substrate or backplane. The resultant display areas exhibit improved uniformity and quality, leading to improved yield of the electronic device produced from the printed and subsequently dried liquid.

Those skilled in the art, having the benefit of the teachings of the present device, may impart modifications thereto. Such modifications are to be construed as lying within the scope of the present claimed invention, as defined by the appended claims.

What is claimed is:

1. A circuit for an electronic device, the circuit comprising:
    a thin film transistor;
    an organic light emitting diode;
    a first electrode;
    a second electrode; and
    a first resistor having a resistor density, wherein the thin film transistor, organic light emitting diode, and the first resistor are located between the first and second electrode, and the first resistor is located between the thin film transistor and the organic light emitting diode and has non-zero resistor density.

2. A circuit for an electronic device, the circuit comprising:
    a thin film transistor;
    an organic light emitting diode;
    a first electrode;
    a second electrode; and a first resistor having a resistor density, wherein the thin film transistor, organic light emitting diode, and the first resistor are located between the first and second electrode, and the first resistor is located between the organic light emitting diode and the second electrode and has non-zero resistor density.

3. A pixel circuit for an electronic device, the pixel circuit comprising:
a thin film transistor;
an organic light emitting diode;
a first electrode;
a second electrode; and
a first resistor, a second resistor, and a third resistor, each resistor having a resistor density, wherein the thin film transistor, organic light emitting diode, and the first, second, and third resistors are located between the first and second electrode, and the resistor density range of each resistor is about zero to $1 \times 10^{-7}$ $\Omega/\mu m^2$ of emitter area of the organic light emitting diode, and at least one of the first, second, or third resistor has non-zero resistor density.

4. The pixel circuit of claim 3, wherein at least two of the first, second, or third resistor have non-zero resistor density.

5. The pixel circuit of claim 3, wherein each of the first, second, and third resistor have non-zero resistor density.

* * * * *